United States Patent
Lilak et al.

(10) Patent No.: US 11,672,133 B2
(45) Date of Patent: Jun. 6, 2023

(54) VERTICALLY STACKED MEMORY ELEMENTS WITH AIR GAP

(71) Applicant: Intel Corporation, Santa Clara, CA (US)

(72) Inventors: Aaron D. Lilak, Beaverton, OR (US); Patrick R. Morrow, Portland, OR (US); Hui Jae Yoo, Hillsboro, OR (US); Sean T. Ma, Portland, OR (US); Scott B. Clendenning, Portland, OR (US); Abhishek A. Sharma, Hillsboro, OR (US); Ehren Mannebach, Tigard, OR (US); Urusa Alaan, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 836 days.

(21) Appl. No.: 16/447,603

(22) Filed: Jun. 20, 2019

(65) Prior Publication Data
US 2020/0403033 A1     Dec. 24, 2020

(51) Int. Cl.
*H10B 63/00*    (2023.01)
*H01L 21/311*   (2006.01)
(Continued)

(52) U.S. Cl.
CPC ...... *H10B 63/845* (2023.02); *H01L 21/31116* (2013.01); *H01L 21/7682* (2013.01); *H10B 41/27* (2023.02); *H10B 43/27* (2023.02)

(58) Field of Classification Search
CPC .......................... H01L 27/249; H01L 21/31116
See application file for complete search history.

(56) References Cited

U.S. PATENT DOCUMENTS 8,847,302 B2    9/2014  Alsmeier et al.
8,878,278 B2    11/2014 Alsmeier et al.
(Continued)

FOREIGN PATENT DOCUMENTS

WO    2018063226 A1    4/2018
WO    2019066829 A1    4/2019

OTHER PUBLICATIONS

"Understanding Flash: What is 3D NAND?", Jan. 26, 2016, 6 pages, retrieved online <URL: https://Flashdba.com/2016/01/26/Understanding-Flash-What-Is-3D-NANDI#Comments>.
(Continued)

*Primary Examiner* — Caleb E Henry
(74) *Attorney, Agent, or Firm* — Schwabe, Williamson & Wyatt, P.C.

(57) ABSTRACT

A memory structure includes conductive lines extending horizontally in a spaced apart fashion within a vertical stack above a base or substrate. The vertical stack includes a plurality of conductive lines, the first and second conductive lines being part of the plurality. A gate structure extends vertically through the first and second conductive lines. The gate structure includes a body of semiconductor material and a dielectric, where the dielectric is between the body and the conductive lines. An isolation material is on at least one side of the vertical stack and in contact with the conductive lines. The vertical stack defines a void located vertically between at the first and second conductive lines in the vertical stack and laterally between the gate structure and the isolation material. The void may extend along a substantial length (e.g., 20 nm or more) of the first and second conductive lines.

19 Claims, 11 Drawing Sheets

(51) Int. Cl.
  *H01L 21/768* (2006.01)
  *H10B 41/27* (2023.01)
  *H10B 43/27* (2023.01)

(56) References Cited

U.S. PATENT DOCUMENTS

| | | | |
|---|---|---|---|
| 8,884,357 B2 | 11/2014 | Wang et al. | |
| 9,520,406 B2 | 12/2016 | Makala et al. | |
| 9,875,929 B1* | 1/2018 | Shukla | H01L 29/40117 |
| 10,217,746 B1* | 2/2019 | Kim | H01L 27/1157 |
| 10,290,648 B1* | 5/2019 | Zhou | H01L 29/41725 |
| 2016/0365352 A1* | 12/2016 | Nishikawa | H01L 28/20 |
| 2017/0053906 A1* | 2/2017 | Or-Bach | H01L 27/11575 |
| 2017/0162597 A1* | 6/2017 | Sharangpani | H01L 23/528 |
| 2018/0090587 A1 | 3/2018 | Bonilla et al. | |
| 2018/0342557 A1* | 11/2018 | Mori | H01L 27/249 |
| 2020/0350203 A1* | 11/2020 | Fratin | H01L 24/17 |
| 2020/0388650 A1* | 12/2020 | Nardi | G11C 13/004 |
| 2020/0395407 A1* | 12/2020 | Takahashi | H01L 45/1683 |
| 2020/0395408 A1* | 12/2020 | Takahashi | H01L 27/2427 |
| 2020/0402988 A1* | 12/2020 | Howder | H01L 27/11556 |
| 2020/0403033 A1* | 12/2020 | Lilak | H01L 27/11575 |

OTHER PUBLICATIONS

Rino Micheloni et al., "Architectural and Integration Options for 3D NAND Flash Memories", Computers, Aug. 10, 2017, 19 pages.

Bryon Moyer, "How It's Built: Micron/Intel 3D NAND Micron Opens the Veil a Little", Electronic Engineering Journal, Feb. 1, 2016, 6 pages.

Karl-Magnus Persson, "Neuromorphic Computing and Emerging Memory Technologies", Lecture, Lund University, Nano Electronics Group, 29 pages, retrieved on May 15, 2019.

* cited by examiner

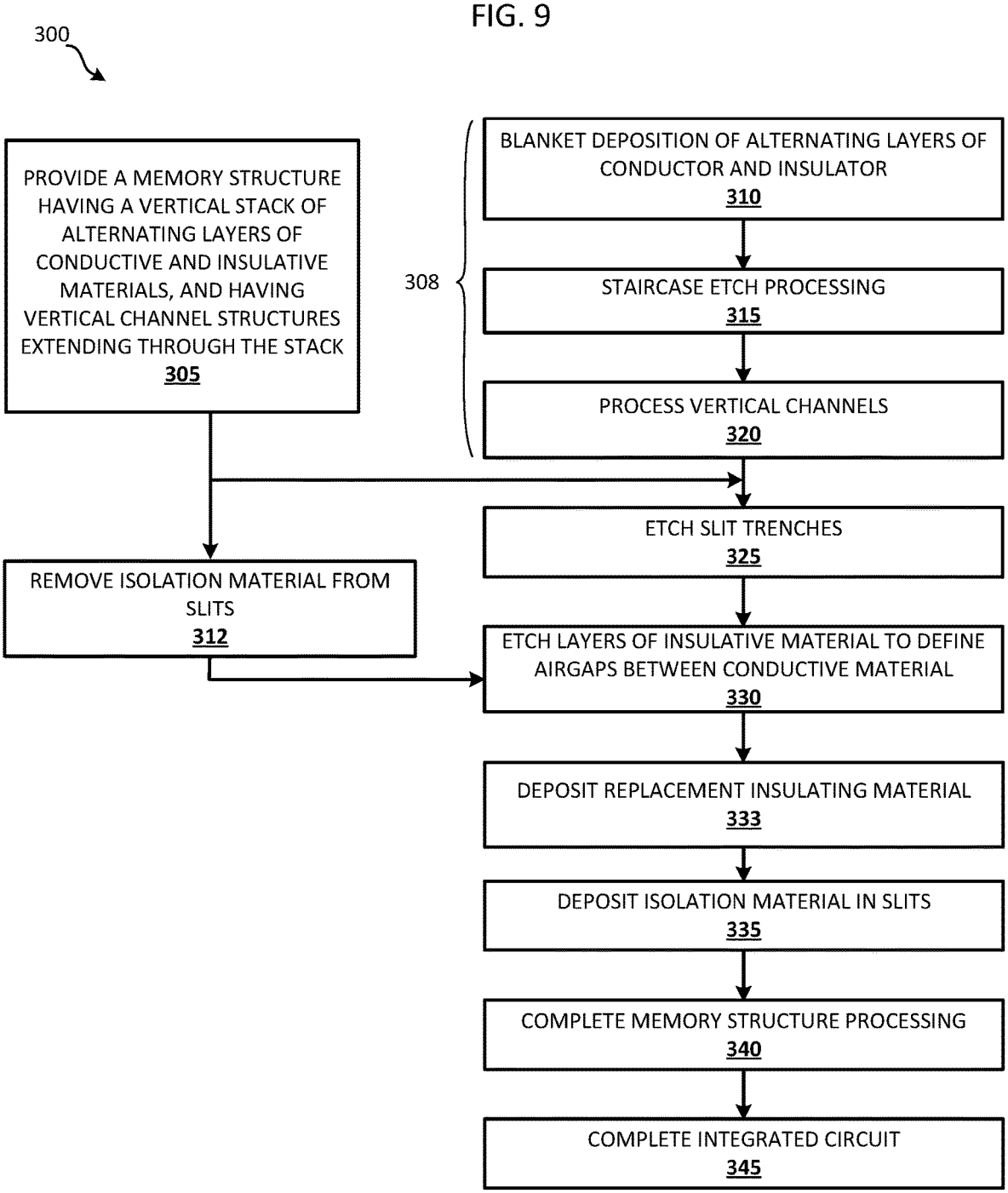

VERTICALLY STACKED MEMORY ELEMENTS WITH AIR GAP

BACKGROUND

Semiconductor devices are electronic components that exploit the electronic properties of semiconductor materials, such as silicon (Si), germanium (Ge), gallium arsenide (GaAs), and indium phosphide (InP), to name a few examples. A field effect transistor (FET) is a semiconductor device that includes three terminals: a gate, a source, and a drain. A FET uses an electric field applied by the gate to control the electrical conductivity of a channel through which charge carriers (e.g., electrons or holes) flow between the source and drain. In instances where the charge carriers are electrons, the FET is referred to as an n-channel device, and in instances where the charge carriers are holes, the FET is referred to as a p-channel device. FETs can be used in memory structures, including arrays of thin-film transistors and vertical memory cells.

Some memory structures, such as dynamic random-access memory ("DRAM") may combine one or more transistor with a capacitor to store one data bit in the form of a positive or negative electrical charge. Other memory structures, such as static random-access memory ("SRAM") may use multiple transistors to store a bit of data through the use of a bistable latch. Other memory structures such resistive random-access memory ("RRAM") or phase change memory ("PCM") may utilize material properties to switch between a low-resistance and a high-resistance state to store a bit of data. Other memory types, such as flash memory, allow for a persistent charge to be induced within an electrically insulated region in close periphery to the gate of a FET transistor, which enables a bit of data to be stored. For example, some memory structures use one transistor and one capacitor, referred to as 1T-1C. Other memory structures use three transistors and one capacitor, referred to as 3T-1C. Other memory structures may utilize zero capacitors and six transistors and are referred to as 6T. Non-trivial challenges accompany the ongoing demand for increased capacity and density of memory structures and other semiconductor devices.

BRIEF DESCRIPTION OF THE DRAWINGS

FIG. 9 is a flow chart showing processes in a method of fabricating a memory structure with voids and/or replacement insulating material between conductive material layers, in accordance with an embodiment of the present disclosure.

Figure 1:
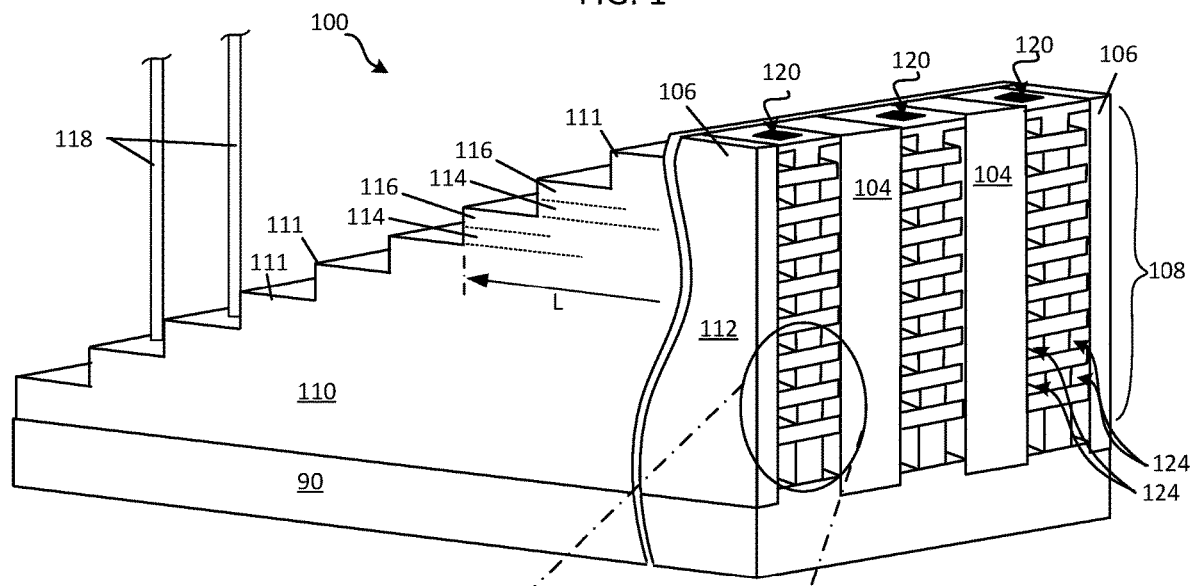
FIG. 1 is a perspective view showing a memory structure with voids between adjacent horizontal lines of conductive material, in accordance with an embodiment of the present disclosure.

The figures depict various embodiments of the present disclosure for purposes of illustration only. Numerous variations, configurations, and other embodiments will be apparent from the following detailed discussion.

DETAILED DESCRIPTION

Disclosed are architectures and methodologies for vertically-stacked memory structures that include a void and/or replacement insulating material between horizontal conductive elements. In one example embodiment, a vertical memory structure includes a void or voids between adjacent horizontally extending conductive lines. The void can be an empty volume (e.g., a vacuum) or a volume containing air or some other gas. In another embodiment, all or part of the void is filled with a replacement insulating material such as a material having a lower dielectric constant than that of the insulating material removed to define the void. a general matter, the horizontal conductive lines can be or include an electrode, a conductive trace, a contact, or combination of these structures. In one embodiment, the conductive lines are wordline conductors in a memory structure where the layers of insulating material are laterally recessed between the wordlines in a layer stack. For example, the insulating material can be partially or completely removed by using an atomic layer etch or other suitable process. The resulting void can have a geometry that conforms to the geometry of the surrounding structure defined by other materials, in accordance with some embodiments. In some embodiments, the resulting void is filled partially or completely with a replacement insulating material of a lower dielectric constant.

A void between conductors has the effect of reducing the permittivity, which in turn reduces capacitance between parallel conductors. In accordance with some embodiments, the reduced capacitance can provide one or more aspects of improved performance, such as faster memory access, reduced power consumption associated with memory access, reduced pre-charge requirements, and a greater number of memory bits controlled by one wordline, for example. A void and/or replacement insulating material of reduced dielectric constant between adjacent conductive lines can also enable further scaling of memory structures without reducing the performance of the resulting structure. For example, reduction in permittivity can be offset to the desired extent by reductions in the distance between conductive lines, thereby providing a reduced overall size of the structure. In some embodiments, the further scaled structure can also benefit from some reduction in capacitance. In other embodiments, the structure can be scaled at least without increasing the capacitance compared to the larger structure.

In one example methodology, conductive material (e.g., metal) and insulating materials are deposited in a stack of alternating blanket layers. The stack of blanket layers can be processed into adjacent memory strings separated by slit trenches, where each memory string includes vertical channel structures extending through the stack. The insulating material in the layer stack can be removed or partially etched back using a wet etch process or atomic layer etching. In some embodiments, the etch process used to remove or recess the insulating material in the layer stack does not impact the memory elements formed with the channel structures, such as the floating gate of a NAND structure or the filament material of a vertical RRAM structure. Specifically, the insulating material can be etched with selectivity to the metal or conductor layer and to the materials comprising the memory storage node. The resulting void or airgap can be located between conductive lines in all or part of the memory structure. For example, the void can be in the region of memory elements, in the region of the staircase structure, or both. For example, the insulating layer is at least partially removed from between conductive lines only in the staircase portion of the memory structure, only in the memory element portion of the memory structure, only in a lower portion of the memory structure, or in other selected locations or combination of locations. In other examples, the insulator is removed partially or completely from between wordline conductors in all regions of the memory structure. Optionally, the resulting void can be filled at least partially with a lower-κ replacement insulating material. Numerous variations and embodiments will be apparent in light of the present disclosure.

General Overview

Three-dimensional memory structures, or vertical memory structures, can be configured with a not- and logic structure (NAND), as a resistive random-access memory (RRAM), as dynamic random-access memory (DRAM), or as a static random-access memory (SRAM), to name a few examples. Some such memory structures may include a staircase structure to make electrical connections with tiers of memory elements. The staircase structure typically includes relatively long conductive lines (e.g., wordlines) that extend horizontally in a vertical stack of alternating material layers of insulating material and conductive lines. A vertical bore can be etched through such stacks and then processed to form memory elements with vertical channel structures. One challenge of increasing the capacity and density of such memory structures is the high-aspect-ratio etch that is needed to form the vertical channel bores and the high-aspect-ratio etch used for the slit etch between strings of memory elements. For example, a vertical sidewall is difficult to achieve as the stack of conductive lines increases in height due to more layers of material and/or the use of thicker material layers. For example, with increased vertical height, the channel bore tends to have a tapered geometry where the diameter of the channel bore at the top level is greater than the diameter at the bottom level. This variation in bore size affects the gate size. Some device performance is highly sensitive to variation in the gate size. Such challenges currently limit some vertical memory structures to 64 material layers.

To address the challenges associated with demands for increased device density and further scaling, one possible approach is to reduce the vertical thickness of the dielectric layer between the conductive lines in order to reduce the overall vertical height of the stack. However, such an approach increases the capacitance since capacitance of parallel conductors is inversely proportional to the separation distance of the conductors. These challenges and others result in a need for structures and methodologies that enable further scaling of vertical memory structures and/or that enable a greater number of layers in vertical memory structures. The present disclosure addresses this need and others.

In accordance with some embodiments, capacitance between conductive lines in a memory structure can be reduced by reducing the dielectric constant between the conductors. Although capacitance is inversely proportional to the separation distance between these conductive lines, capacitance also is a linear function of the relative permittivity (dielectric constant) of the material between conductive materials, as will be appreciated. An expression for the capacitance of parallel conductors can be written as follows:

$$capacitance, C = \kappa \varepsilon_0 A / d$$

where $\kappa$=the relative permittivity, $\varepsilon_0$=the permittivity of space=8.854 E-10 F/m, A=the area of the conductive materials, and d=the separation distance between the conductors. The value of $\kappa$=1 for air, $\kappa$>1 for other materials, and $\kappa$=3.9 for $SiO_2$ according to some measurement methods. Accordingly, the capacitance of parallel conductive lines can be reduced by replacing all or part of the dielectric material ($\kappa$>1) between adjacent conductive lines with an air gap or a void ($\kappa$~1). In combination or alternatively, the vertical size can be reduced for a memory structure that includes such voids without increasing the capacitance, thereby enabling a greater number of layers in a stack. For example, in some embodiments, the memory structure can have 128 or more layers.

Techniques of the present disclosure can be applied to any stacked memory structure that includes parallel horizontal conductors, including but not limited to, resistive random access memory (RRAM), dynamic random access memory (DRAM), static random access memory (SRAM), and phase change memory (PCM).

As discussed herein, terms referencing direction, such as upward, downward, vertical, horizontal, left, right, front, back, etc., are used for convenience to describe embodiments of integrated circuits having a base or substrate extending in a horizontal plane. Embodiments of the present disclosure are not limited by these directional references and it is contemplated that integrated circuits and device structures in accordance with the present disclosure could be used in any orientation.

Note that materials described as being "compositionally different" or "compositionally distinct" as used herein refers to two materials that have different chemical compositions. This compositional difference may be, for instance, by virtue of an element that is in one material but not the other (e.g., $SiO_2$ is compositionally different from $Si_3N_4$), or by way of one material having all the same elements as a second material but at least one of those elements is intentionally provided at a different concentration in one material relative to the other material (e.g., SiGe having 70 atomic percent germanium is compositionally different from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon.

As also used herein, the term "low-κ" refers to a material having a dielectric constant equal to or less than that of silicon dioxide ($SiO_2$), which has a value of 3.9 according to some measurement methods. Examples of low-κ materials include amorphous carbon, aluminum oxide ($Al_2O_3$), spin-on glass, silicon oxycarbides (SiOCH), fluorine-doped $SiO_2$, carbon-doped $SiO_2$, and silsesquioxanes, to provide a few examples. As also used herein, the term "high-κ" refers to materials having a dielectric constant greater than that of silicon dioxide ($SiO_2$). Examples of high-κ dielectric materials include hafnium dioxide ($HfO_2$), zirconium dioxide ($ZrO_2$) and titanium dioxide ($TiO_2$) to provide some examples.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, TEM can be useful to show a cross section of an integrated circuit or die that includes voids, rather than a solid, between spaced-apart conductive lines in a memory structure.

Example Structures

FIG. 1 illustrates a perspective view of a vertical memory structure 100 formed on a base or substrate 90 and including a plurality of memory strings 102 separated by an insulating gap fill material 104, in accordance with an embodiment of the present disclosure. In one example, the substrate is bulk silicon or other bulk semiconductor, such as a semiconductor wafer or part thereof. The substrate can include one or more insulator, conductor, and/or semiconductor material layers on top of the bulk material layer (e.g., semiconductor wafer). In one example, the substrate 90 includes electronic grade silicon that may or may not be doped. Numerous variations and embodiment will be apparent in light of the present disclosure.

In some embodiments, the memory structure 100 includes alternating layers of insulating material 114 and conductive material 116 to define a vertical layer stack 108. The layer stack can include a staircase portion 110 and a memory cell portion 112, in accordance with some embodiments. Individual layers of the layer stack 108 extend horizontally through the memory cell portion 112 and along at least a portion of the staircase portion 110, where the staircase portion 110 is defined by successively increasing or decreasing lengths of material layers extending from the memory cell portion 112. For example, each step 111 of the staircase portion 110 includes a layer of insulating material 114 and a layer of conductive material 116 stacked on top of one another and having a step length L. In other embodiments, the staircase portion 110 is omitted, where contacts are made with each conductive line 116 using other suitable connectivity, as will be appreciated.

The step length L can be defined as a horizontal distance from the memory cell portion 112 or some other reference point in the stack (e.g., the channel structure 120 closest to the staircase portion 110). For example, for a given step 111 the step below it has a longer step length L and the step above it has a shorter step length L, therefore defining a stepped structure in which the conductive material 116 of a given step 111 can be accessed from above by making an electrical connection to a vertical contact 118, as will be appreciated. Although the example of FIG. 1 is illustrated as having a single staircase portion 110, the memory structure 100 can include a staircase portion on opposite lateral sides of the memory cell portion 112 or can have frontside and backside staircases. Examples of such structures are shown and discussed below with reference to FIGS. 4 and 6.

Channel structures 120 extend vertically through the layer stack 108 to define a memory cell at each layer of conductive material 116. Each channel structure 120 can have a cross-sectional shape that is round, rectangular, or other geometry. Each channel structure 120 includes a semiconductor channel material, such as polysilicon, and a dielectric (e.g., a high-κ dielectric) between the channel material and the layer of conductive material 116. The channel material can be referred to as a vertical electrode and the horizontal layer of conductive material 116 can be referred to as a horizontal electrode, in accordance with some embodiments. Other materials can be present in each memory cell, such as charge-trapping materials, insulating dielectrics, and native oxides, for example. The structure of the channel structure 120 may vary depending on the intended use of the memory structure 100, as will be appreciated.

Each memory string 102 includes a layer stack 108 with one or more channel structures 120 aligned along the memory cell portion 112 of the string 102. Adjacent memory strings 102 are separated by a gap fill material 104, such as an insulating dielectric. Sides of the memory structure 100 are clad with a spacer material 106, which may be the same as or different from the gap fill material 104. In the example structure of FIG. 1 only one channel structure 120 is shown per memory string 102. However, note that each memory string 102 can have two, four, eight, sixteen, thirty-two, sixty-four, one hundred twenty-eight, or any other number of channel structures, as will be appreciated.

Figure 2:
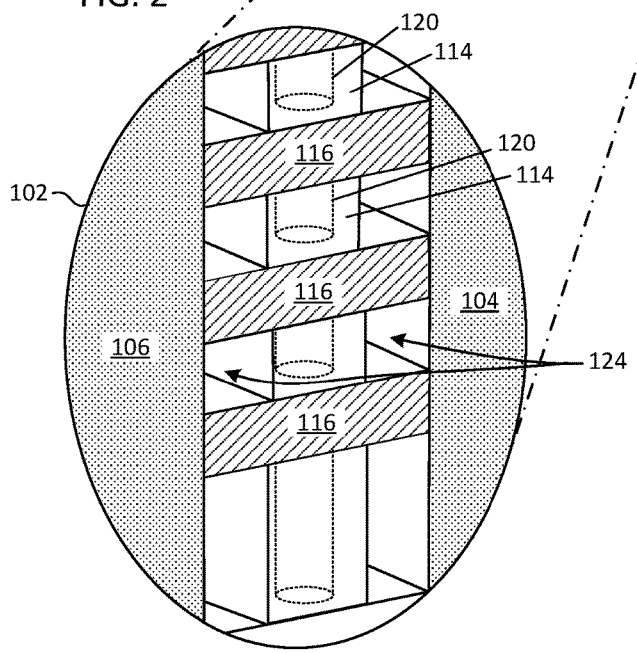
FIG. 2 is a close-up view of a portion of a memory string of the structure shown in FIG. 1, in accordance with an embodiment of the present disclosure.

Referring now to FIG. 2, a close-up view shows a portion of one of one memory string 102 of FIG. 1. In this example, spacer material 106 extends along the left side of the memory string 102 and gap fill material 104 extends along the right side of the memory string 102. Channel structures 120 (only one is visible) extend vertically through the layers of conductive material 116, which extend horizontally and have a rectangular cross-sectional profile. Insulating material 114 is on the channel structure 120 between adjacent layers of conductive material 116 so that the channel structure 120 is surrounded circumferentially by insulating material 114. An airgap or void 124 is defined between vertically adjacent layers of conductive material 116. The void 124 results from complete or partial removal of the layer of insulating material 114 between the layers of conductive material 116, in accordance with some embodiments. In one example, the void 124 is positioned vertically between layers of conductive material 116 where all or substantially all (e.g., except for trace amounts) of the insulating material 114 has been removed above and below the void 124. The void 124 is further positioned horizontally between the channel structure 120 on one side (which may or may not have a layer of insulating material 114) and gap fill material 104 or spacer material 106 on the other side.

Figure 3:
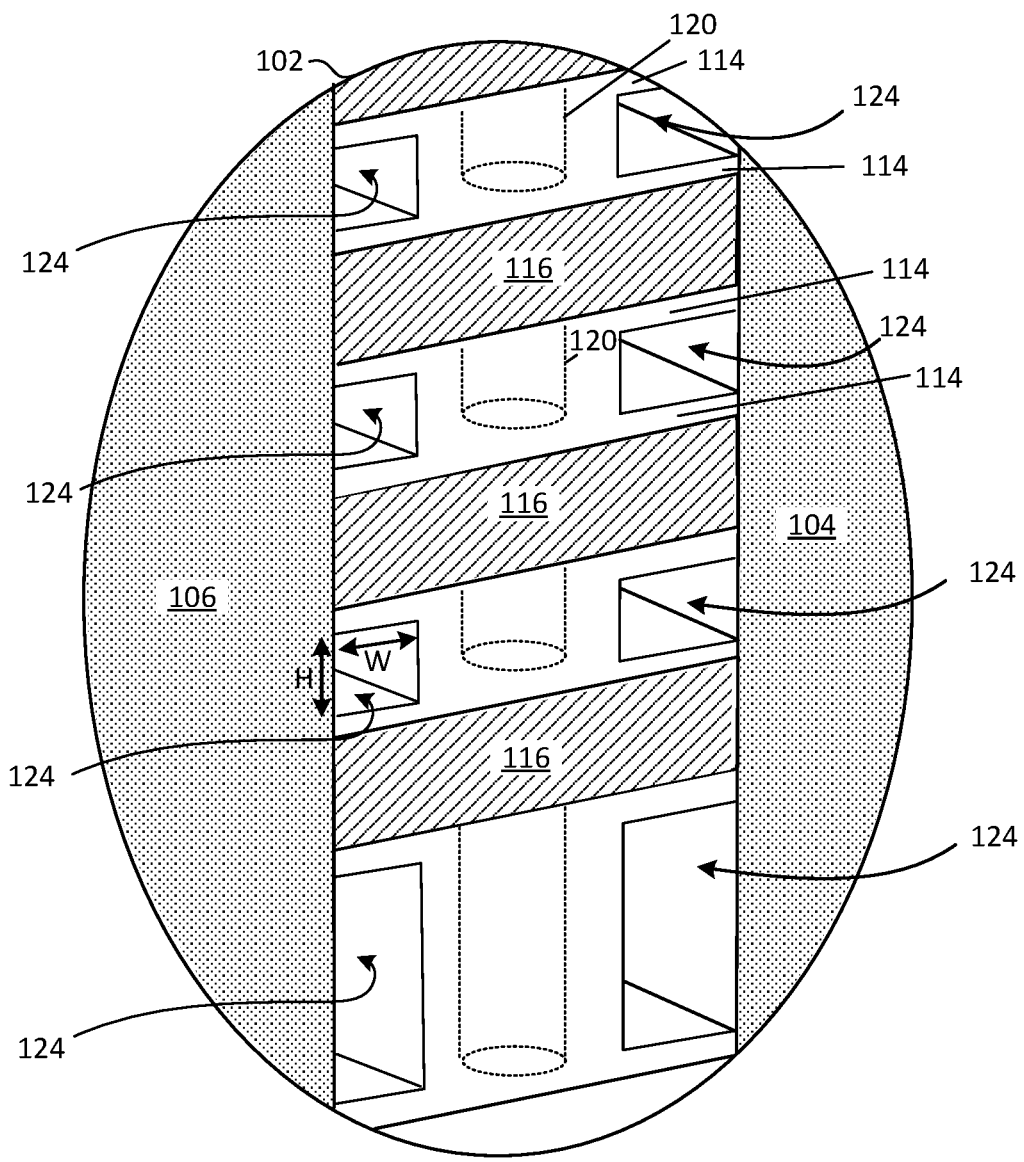
FIG. 3 is a close-up view of part of a memory structure showing partial removal of layers of the insulating material in a layer stack to define voids between adjacent conductive layers, in accordance with an embodiment of the present disclosure.

In accordance with some embodiments, etch processing that is used to remove or recess the insulating material 114 results in a conformal profile of the void 124. In one such example shown in FIG. 3, the voids 124 have a cross-sectional shape that is consistent with the profile of the materials surrounding the insulating material. Here, the voids 124 have a rectangular cross-sectional shape that is consistent with the rectangular profile defined by the layers of conducive material 116 above and below the void 124 and the gap fill material 104 or spacer material 106 at the side of the void 124. In some such embodiments, each layer of conductive material 116 includes some insulating material 114 on its top and bottom surfaces such that the void 124 is positioned vertically between insulating material 114 on the top and bottom surfaces of layers of conductive material 116 above and below the void 124, respectively. The void 124 is further positioned horizontally between the insulating material 114 surrounding the channel structure 120 on one side and the gap fill material 104 or spacer material 106 on the other side. In one example, each void has a vertical height H from 2-50 nm, a horizontal length from 20-200 nm, and a lateral width W of 5-20 nm. In some embodiments, the cross-sectional shape of voids 124 is the same in the memory element portion 112 as it is in the staircase portion or at opposite ends of the memory structure 100.

Figure 4:
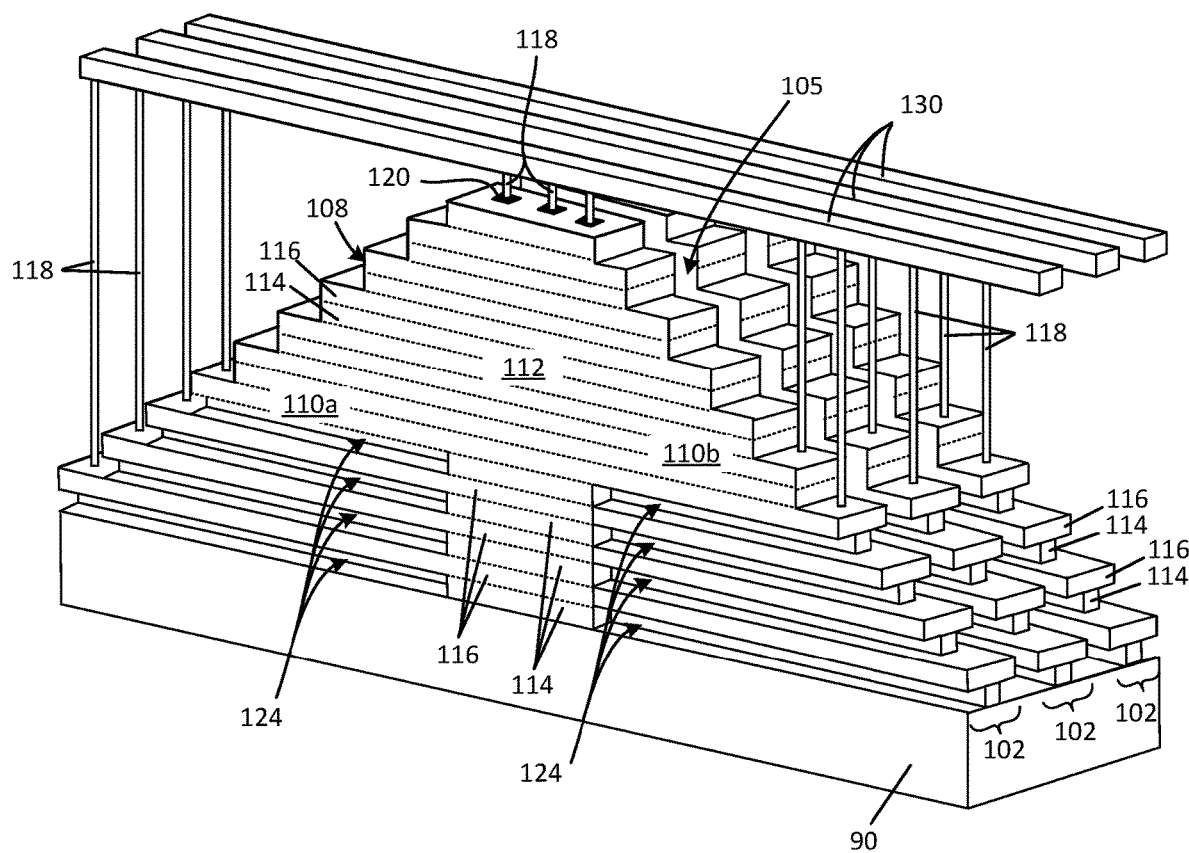
FIG. 4 is a perspective view showing a memory structure with voids between horizontal conductive lines in a lower portion of the staircase portions of the structure, in accordance with an embodiment of the present disclosure.

Referring now to FIG. 4, a perspective view illustrates a vertical memory structure 100 in accordance with another embodiment of the present disclosure. In this example, the memory structure 100 is on a base 90 of semiconductor material and includes a plurality of memory strings 102 separated by slit trenches 105. Gap fill material 140 and spacer material 106 are omitted for clarity. Each memory string 102 includes a layer stack 108 with alternating horizontal layers of insulating material 114 and conductive material 116. The layer stack 108 has a memory cell portion 112 and a staircase portion 110. The memory cell portion 112 has channel structures 120 (e.g., a vertical electrode or transistor channel) that extend vertically through the layer stack 108 and defines a memory cell 140 (not visible) at each intersection of the conductive material 116 with the channel structure 120. Examples of a memory cell 140 are discussed below in more detail. The staircase portion 100 includes a first staircase portion 110a on one side of the memory cell portion 112 and an optional second staircase portion 110b on an opposite side of the memory cell portion 112. For example, the first staircase portion 110 ascends one side of the memory cell portion 112 and the second staircase portion 110b ascend the opposite side of the memory cell portion 112 in the opposite direction. In some embodiments, the first staircase portion 110a generally mirrors the second staircase portion 110b and has about the same number of steps 111; in other embodiments, the first staircase portion 110a can have more or fewer steps 111 than the second staircase portion 110b. Contacts 118 extend vertically and make electrical contact with the layers of conductive material 116 in the staircase portion 110 and with channel structures 120 in the memory cell portion 112. Bitlines 130 connect to the contacts 118 above the layer stacks 108. Although this example includes both the first and second staircase portions 110a, 110b, some vertical memory structures 110 may only include one of the first or second staircase portion 110a, 110b, as will be appreciated.

In the example of FIG. 4, layers of insulating material 114 in the lower portion of the first and second staircase portions 110 have been recessed to define a void 124 between vertically adjacent layers of conductive material 116. In other embodiments the voids 124 can extend along the entire length of the conductive material 116. In some embodiments, a void 124 is present between some or all of the adjacent layers of conductive material 116. For example, voids 124 may be present in all or part of the staircase portion 110, in all or part of the memory cell portion 112, or in a combination of these locations. Numerous variations and embodiments will be apparent in light of the present disclosure.

Figure 5:
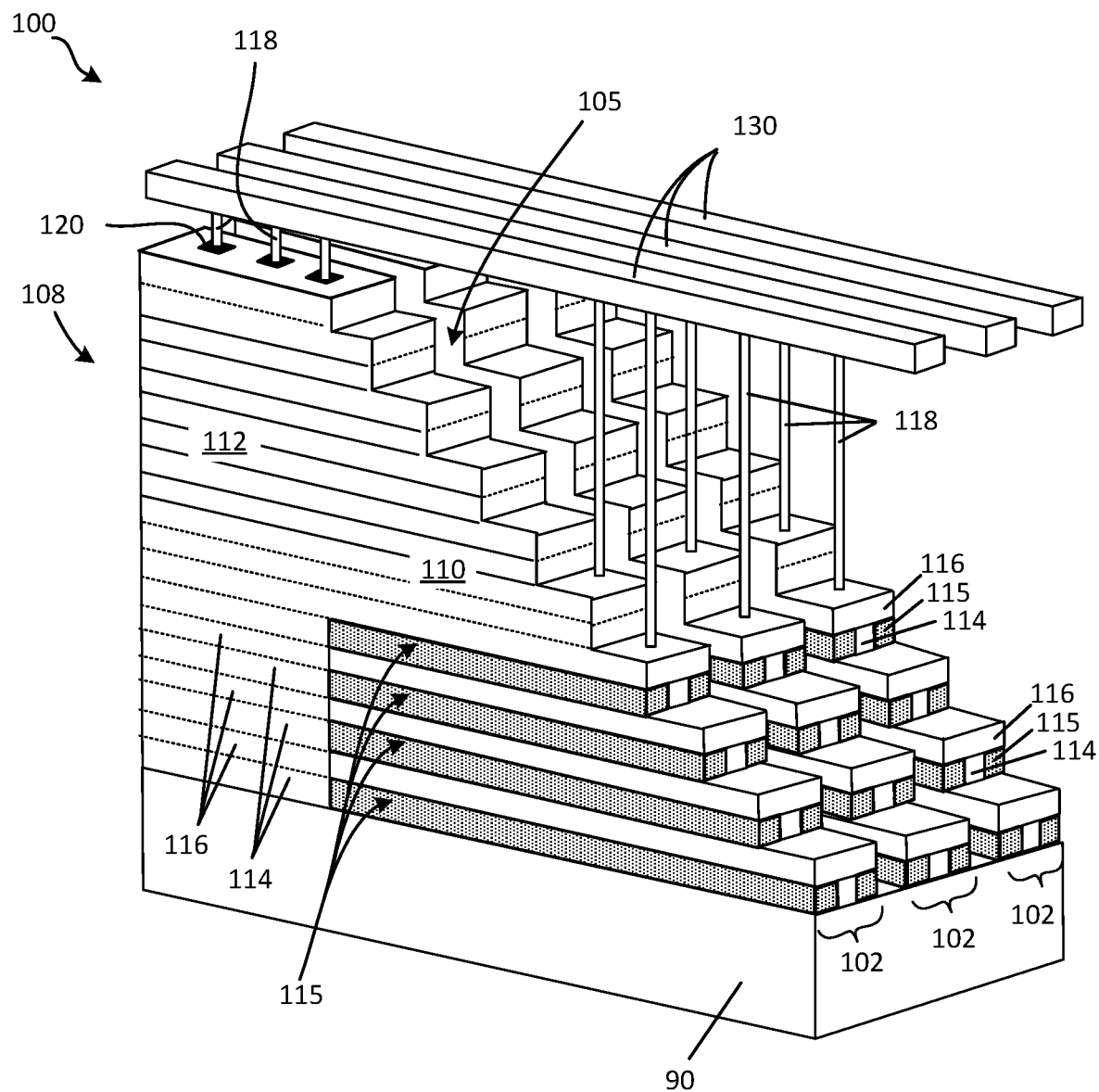
FIG. 5 is a perspective view showing a memory structure with replacement insulating material between horizontal conductive lines in a lower portion of the staircase, in accordance with another embodiment of the present disclosure.

Referring now to FIG. 5, a perspective view illustrates part of a vertical memory structure 100, in accordance with another embodiment of the present disclosure. Similar to the embodiment of FIG. 4, the memory structure 100 includes a plurality of memory strings 102 separated by slit trenches 105. Gap fill material 140 and spacer material 106 are omitted for clarity. Each memory string 102 includes a layer stack 108 with alternating horizontal layers of insulating material 114 and conductive material 116. The layer stack 108 has a memory cell portion 112 and a staircase portion 110. The memory cell portion 112 has channel structures 120 (e.g., a vertical electrode or transistor channel) that extend vertically through the layer stack 108 and defines a memory cell 140 (not visible) at each intersection of the conductive material 116 with the channel structure 120.

In this example, some of the insulating material 114 (e.g., a first insulating material) in each memory string 102 has a lateral width that is smaller than that of the neighboring conductive material 116 above and below. A second or replacement insulating material 115 is adjacent the first insulating material 114 between neighboring layers of conductive material 116. In this example, the first insulating material is on the channel structure 120 and the replacement insulating material 115 is adjacent the first insulating material 114 and between vertically adjacent conductive materials 116. In some such embodiments, the replacement insulating material 115 is a low-κ material with a dielectric constant κ that is lower than that of the first insulating material 114. For example, the replacement insulating material 115 is poly(methyl methacrylate) ("PMMA") pore-destuffed organosilicate glass, porous silica, or other suitable material. Such structure can be achieved by partially or completely filling the gap 124 that results from etching the first insulating material 114. Thus, adjacent conductive material 116 layers can be separated vertically by a void 124; a void and the first insulating material 114 along the channel structure 120; a lower-κ replacement insulating material 115; both a void 124 and replacement insulating material 115; or a combination of the first insulating material 114 adjacent the channel structure 120, a void 124, and replacement insulating material 115 where the void 124 is laterally between the first insulating material 114 and the replacement insulating material 115. Numerous variations and embodiments will be apparent in light of the present disclosure.

Figure 6:
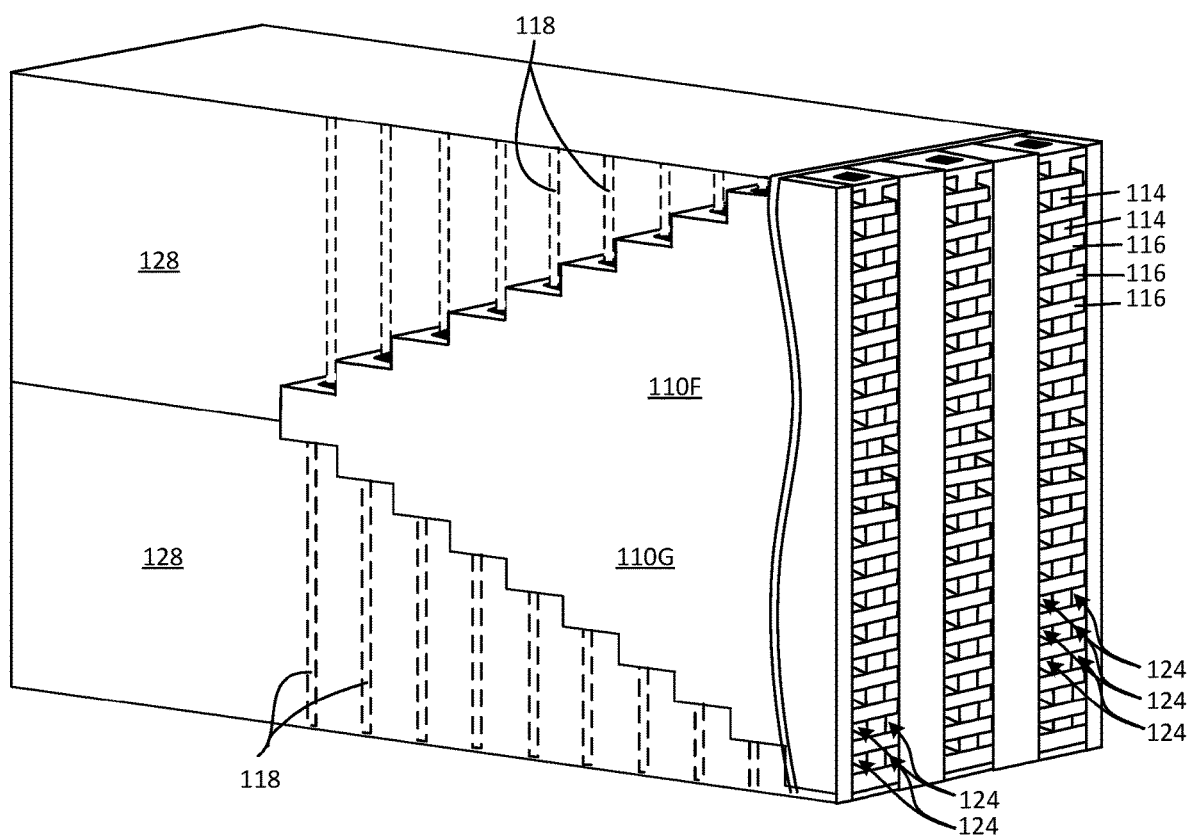
FIG. 6 is a perspective view showing a memory structure with a frontside staircase and a backside staircase that includes voids and/or replacement insulating material between adjacent lines of conductive material, in accordance with another embodiment of the present disclosure.

Referring now to FIG. 6, a perspective view illustrates a vertical memory structure 100, in accordance with yet another embodiment of the present disclosure. In this example, the memory structure 100 has a frontside staircase 110F and a backside staircase 110G that define a wedge shape, such as may be accomplished with frontside processing and backside processing, respectively. An advantage of such structure is that the length of the memory structure, and therefore area on the chip, is reduced compared to other geometries. The backside staircase 110G generally mirrors the frontside staircase 110F about a horizontal plane. That is, the backside staircase 110G is vertically inverted compared to the frontside staircase 110F. Even though FIG. 5 shows the frontside and backside staircase 110F, 110G as being generally symmetrical about a horizontal plane, the frontside staircase 110F and the backside staircase 110G need not have the same number of steps 116 nor the same material layer thicknesses, although some such symmetry may facilitate fabrication, in accordance with some embodiments. As with other embodiments discussed above, the frontside and backside staircases 110F, 110G include contacts 118 and alternating layers of conductive material 116 and insulating material 114. In this example, the contacts 118 extend through interlayer dielectric 128 toward the respective frontside or backside of the memory structure 110 and connect to routing and contacts as needed.

In the embodiment of FIG. 6, all or part of the frontside staircase 110F, all or part of the backside staircase 110G, or both, can define a void between adjacent conductive material 116. Such voids 124 optionally can be partially or completely filled with a replacement insulating material 115 (shown in FIG. 5) in additional processing. For example, voids 124 and/or replacement insulating material 115 can be found only between lines of conductive material 116 of a minimum length, only in the backside staircase 110G, or between only certain portions of the conductive lines 116. In another example, a void exists between every adjacent line of conductive material 116. Numerous variations and embodiments will be apparent in light of the present disclosure.

Figure 7:
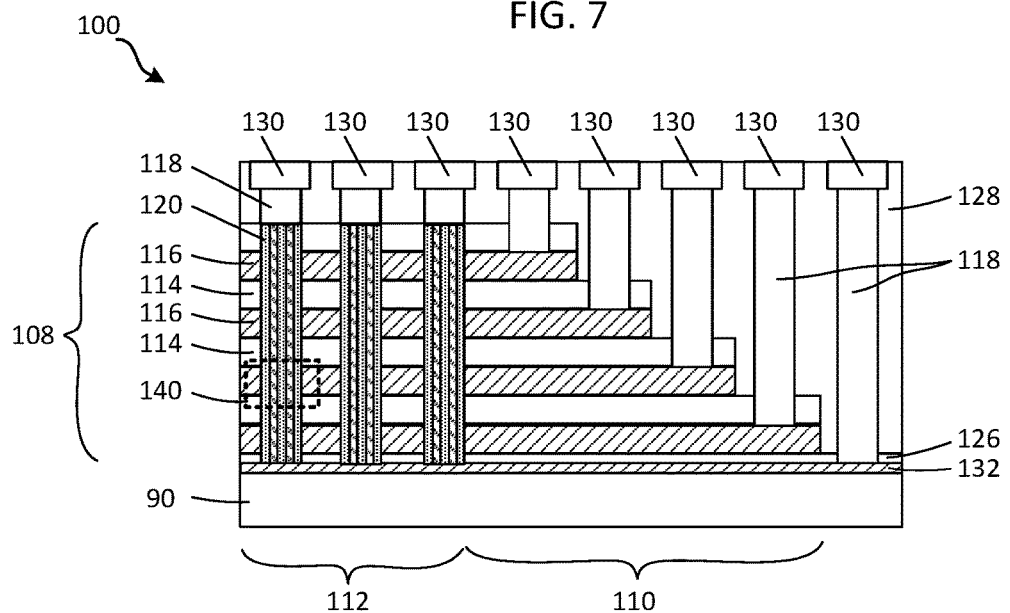
FIG. 7 is a cross-sectional view showing a memory structure, in accordance with another embodiment of the present disclosure.

Referring now to FIG. 7, a cross-sectional view illustrates an example of a vertical memory structure 100 on a base 90 of semiconductor material, in accordance with another embodiment of the present disclosure. A layer stack 108 includes alternating layers of conductive material 116 and insulating material 114, similar to some embodiments discussed above. A layer of isolation material 126 is between the bottom of the layer stack 108 (e.g., bottom layer of conductive material 116) and the top of the base 90 (e.g., top surface of a semiconductor wafer or other material layer thereon). Contacts 118 extend vertically through interlayer dielectric 128 to make electrical connections with horizontal layers of conductive material 116 in the staircase portion 110, which are wordlines or wordline conductors in this example. Contacts 119 also extend vertically to make contact with an upper end of the channel structures 120, which extend vertically through the layers of conductive material 116 in the memory cell portion 112. In some embodiments, the channel structures 120 make contact with a select line 132 below the layer stack 108. Bitlines or bitline conductors 130 make contact with an upper end of each contact 118. A memory cell 140 is defined at the overlap between each channel structure 120 and each layer of conductive material 116 (e.g., wordline).

Figure 8A:
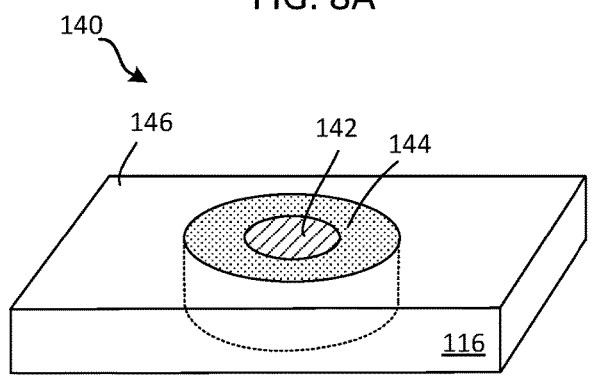
FIGS. 8A and 8B are perspective views showing example memory cells, in accordance with some embodiments of the present disclosure.
Figure 8B:
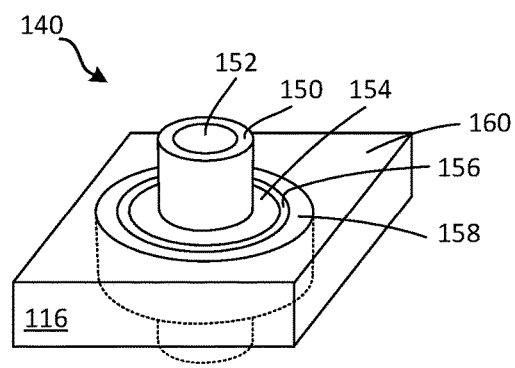

Referring now to FIGS. 8A and 8B, perspective views illustrate examples of a memory cell 140, in accordance with some embodiments. In FIG. 8A, the memory cell 140 includes a vertical electrode 142 that extends vertically through a horizontal electrode 146 defined by a layer of conductive material 116 in the memory structure 110. The memory cell 140 of FIG. 8A is an example of a memory cell in a RRAM memory structure. A layer of dielectric 144 is on the outside of the vertical electrode 142 and positioned between the vertical electrode 142 and the horizontal electrode 146. The vertical electrode 142 can be of a metal, polysilicon, or other conductor or semiconductor. The vertical electrode 142 can have a circular, rectangular, polygonal, or other cross-sectional shape. Although shown as a solid of one material across its diameter, the vertical electrode 142 can have a core of a different material, such as another conductor or a dielectric. The vertical electrode 142 is surrounded circumferentially by a high-κ dielectric 144, where the dielectric 144 is between the vertical electrode 142 and the layer of conductive material 116 that defines a horizontal electrode 146.

In FIG. 8B, the memory cell 140 has floating gate configuration, such as may be used in NAND flash memory, as will be appreciated. The memory cell 140 includes a cylindrical channel 150 of semiconductor material, such as polysilicon. The channel 150 optionally has a core 152 of dielectric material, such as silicon dioxide ($SiO_2$). A tunnel oxide or first dielectric layer 154 (e.g., $SiO_2$) is on the outside of the channel 150, followed by a layer of charge trapping material or second dielectric 156 (e.g., silicon nitride ($Si_3N_4$)), and then a layer of blocking oxide or third dielectric 158 (e.g., $SiO_2$). The control electrode 160 (e.g., tungsten and titanium nitride) is the layer of conductive material 116 of the memory structure 100 and is on the outside of the third dielectric 158. Variations in materials and layers are acceptable and may depend on the intended application, dimensions, and performance requirements of the memory structure 100, as will be appreciated.

Fabrication

Referring now to FIG. 9 a flow chart illustrates processes in a method 300 of fabricating a memory structure with voids between adjacent conductive lines, in accordance with some embodiments of the present disclosure. Along with the discussion of method 300, example structures at various stages of processing will be discussed with reference to FIGS. 10-15. In general, method 300 can be performed using any suitable semiconductor fabrication techniques, including deposition, photolithography, wet or dry chemical etching processes (e.g., atomic layer etch, plasma etch, SC1 etch), chemical mechanical polishing, deposition or epitaxial growth processes (e.g., CVD, PVD, ALD, VPE, MBE, LPE), melt regrowth, and/or any other suitable processing, as will be appreciated.

In one embodiment, method 300 begins with providing 305 a memory structure having a vertical layer stack of alternating layers of conductive and insulative material, where the layer stack includes channel structures extending vertically through the layer stack. In some embodiment, the provided memory structure can be substantially completed or can be at an intermediate stage of processing.

In one example, the memory structure has a plurality of memory strings separated by slit trenches filled with gap fill material. In such embodiments, method 300 continues with removing 312 the gap fill material from between the memory strings and other isolation or spacer material along sides of the layer stack. Process 312 can be performed using any suitable wet or dry etch process. In one example, process 312 is performed using a wet etch process selective to the layers of insulating material in the layer stack, where layers of the insulating material are unaffected or substantially unaffected by the etch while removing the gap fill material.

In another embodiment, the memory structure is ready for etching slit trenches. In some such embodiments, method 300 proceeds with etching 325 slit trenches in the layer stack to define a plurality of parallel layer stacks. An example of slit trench processing is discussed in more detail below.

Figure 10:
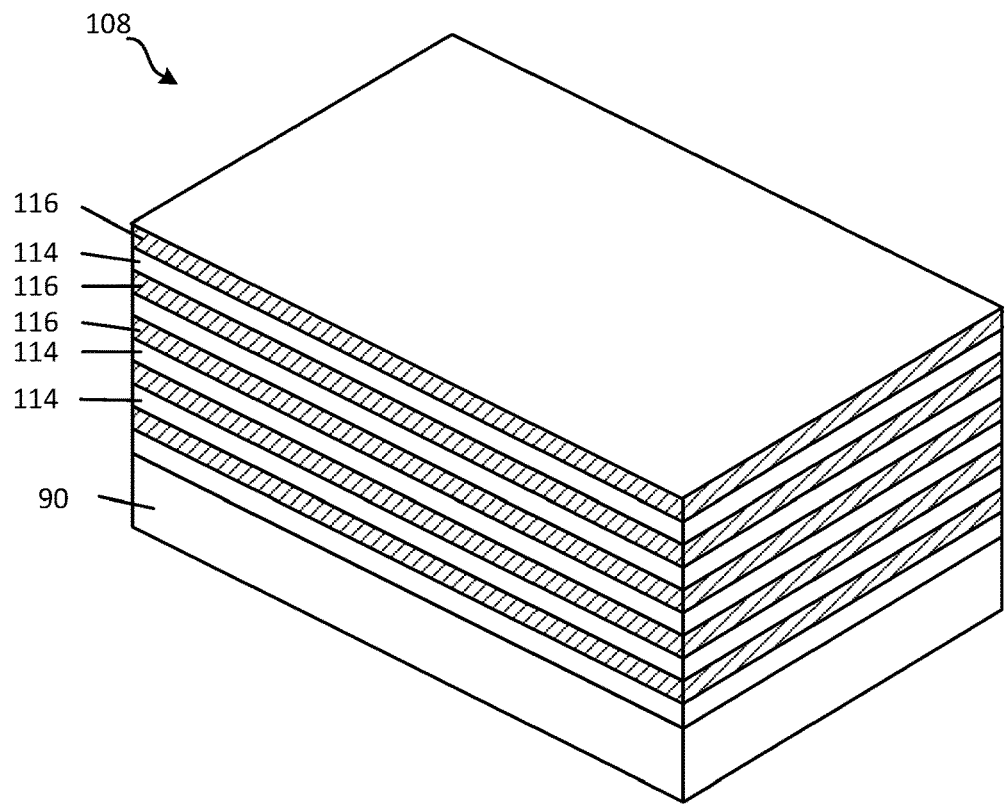
FIG. 10 is a perspective view of a layer stack with alternating layers of insulating material and conductive material, in accordance with an embodiment of the present disclosure.

In other embodiments, such as where the memory structure is not provided, method 300 begins with defining 308 a memory structure on a base or substrate. In one example, defining 308 the memory structure includes film deposition 310 of alternating layers of conductive and insulating materials to define a layer stack. In one example, the insulating material is a nitride (e.g., $Si_xN_y$) and the layer of conductive material includes tungsten, titanium nitride (TiN), silver, gold, copper, platinum or a combination of these materials. FIG. 10 illustrates a perspective view of an example layer stack 108 on a substrate 90, where the layer stack 108 includes alternating thin films of conductive material 116 and insulating material 114. In some embodiment, the layers of conductive material can have a thickness of 5-50 nm and a vertical spacing from 5 to 50 nm, including 5-10 nm, 5-20 nm, 5-30 nm, 10-30 nm, 10-50 nm, 20-50 nm, 30-40 nm, and 30-50 nm. In one example, the layer stack 108 has 128 or more layers.

Figure 11:
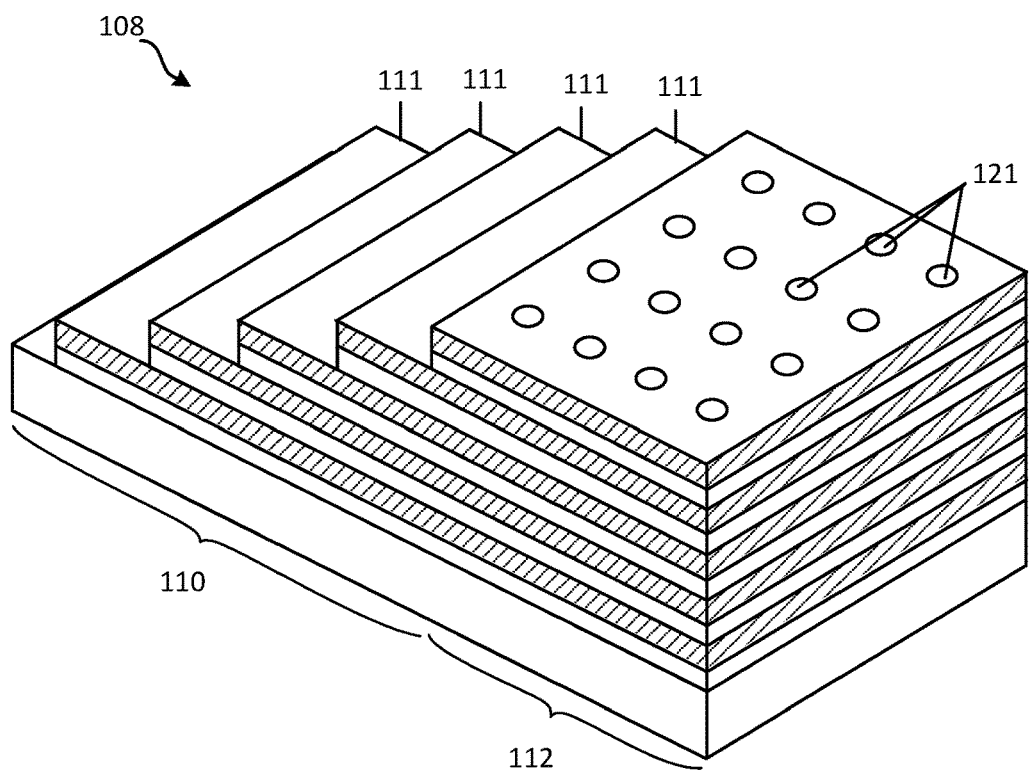
FIG. 11 is a perspective view of the layer stack of FIG. 10 after etching channel bores and etch processing to define a staircase portion, in accordance with an embodiment of the present disclosure.

Defining 308 the memory structure continues with staircase etching 315 to define a staircase structure having a plurality of steps. For example, staircase etching 315 includes deposition of a mask material on part of the layer stack and leaving an end portion of the layer stack exposed. The exposed portion of the layer stack is etched through one course of insulative material and conductive material using an anisotropic etch process to define a step. The staircase can be further processed by trimming back the mask material and repeating the etch process through one course of insulative and conductive materials and repeating the trimming and etching processes to arrive at layer stack having one or more staircase portions. FIG. 11 is a perspective view showing an example of a layer stack 108 after defining the staircase portion 110 with a plurality of steps 111, and etching channel bores 121 in the memory cell portion 112.

In embodiments that include a frontside staircase and a backside staircase, staircase processing 315 may be performed by fabrication performed on the frontside of the wafer, followed by a backside reveal process to remove at least some of the substrate and staircase etch performed to create the backside staircase, as will be appreciated.

Defining 308 the memory structure continues with processing 320 vertical channel structures in a memory cell section of the layer stack. Note that process 308 can be performed before or after the staircase etch processing 315, in accordance with some embodiments. In one example, vertical channel bores are etched through the layer stack using an anisotropic etch process. In the case of a channel structure such as shown in FIG. 8A, for example, processing 320 includes depositing a layer of dielectric on the sidewall of the channel bore, followed by gate electrode deposition. The gate electrode can have a hollow cylindrical shape that is subsequently filled with a dielectric (e.g., $SiO_2$), or the lined bore can be filled with the material of the electrode, such as polysilicon, tungsten, or platinum, to name a few examples. In the case of a channel structure such as shown in FIG. 8B, processing 320 includes recessing the layer of conductive material 116 using a metal etch process, followed by deposition of the gate dielectric and floating gate electrode. Layers of material for the charge trapping layer, tunnel oxide layer, and channel are subsequently deposited along an inside surface of the bore, for example. In another example, an oxygen-nitrogen-oxygen (ONO) film is deposited along the inside surface of the gate electrode prior to deposition of a polysilicon channel. The channel can have a solid cylindrical shape or can have a hollow cylindrical shape that is filled with a dielectric, for example. In one example, the gate oxide and tunnel oxide are silicon oxide (e.g., $SiO_2$), the charge trapping layer is silicon nitride (e.g., $Si_3N_4$), and the channel is polysilicon. Numerous variations and embodiments will be apparent in light of the present disclosure.

Method 300 continues with etching 325 slit trenches in the layer stack to define a plurality of memory strings. In some embodiments, process 325 is performed using a high aspect ratio etch process, such as a deep reactive ion etch (DRIE), a plasma etch, or other suitable highly anisotropic etch process. In some embodiments, slit trenches extend below the layer stack and into the base or substrate. The etching 325 of slit trenches can be performed either before or after processing the channel structures, in accordance with some embodiments.

Figure 12:
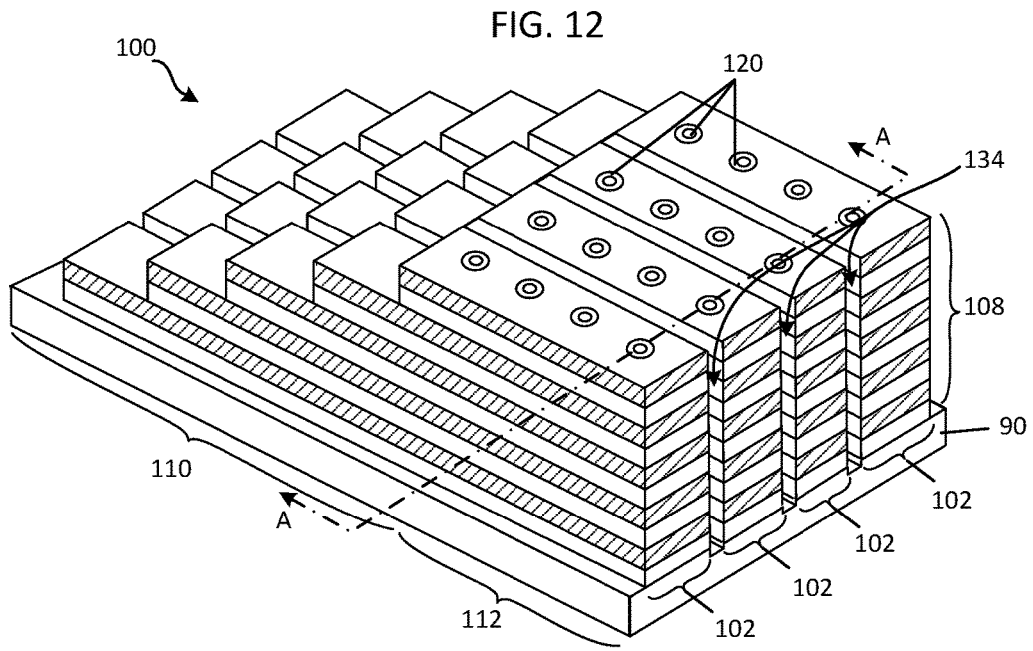
FIG. 12 is a perspective view of the layer stack of FIG. 11 after processing the channel structures and etching slit trenches, in accordance with an embodiment of the present disclosure.

FIG. 12 is a perspective view of a memory structure 100 after processing 320 the vertical channel structures 120 and etching 325 slit trenches 134. FIG. 12 also represents an example of the structure after removing isolation material and gap fill material in embodiments where the memory structure has been provided, for example. The memory structure 100 of FIG. 12 includes a plurality of memory strings 102 separated by slit trenches 134, where each memory string 102 including a memory cell portion 112 and a staircase portion 110. In this example, each slit trench 134 extends into the substrate 90 to enable complete access to the bottom layer of the layer stack 108 for subsequent processing.

Method 300 continues with laterally recessing 330 layers of insulating material in the layer stack to define voids between vertically adjacent layers of conductive material. Process 330 can be performed using suitable wet or dry etch processing methods. In one example, process 330 is performed using an atomic layer etch (ALE) process. In some such embodiments, the ALE etch is highly selective and can precisely remove the layer of insulating material in the layer stack without disturbing the gate dielectric in a floating gate channel structure of a NAND memory structure or the filament material in a RRAM memory structure, as will be appreciated.

In some embodiments, the insulating material in the layer stack be selected from silicon dioxide, silicon nitride, aluminum nitride, aluminum oxide, gallium oxide, zinc oxide, titanium dioxide, zirconium dioxide, or hafnium dioxide. The vapor phase etch of such dielectric materials may be accomplished by heating the substrate, typically to between 150-400° C., under reduced pressure, typically 0.1 to 500 Torr, and exposing the substrate to one or more vapor phase species alternating with purge steps to remove volatile etch products. In the case of some materials, a chemical vapor etch may be employed involving the introduction of a vapor phase etchant followed by a purge to remove unused etchant and volatile etch products. For example, $TiO_2$ can be removed through vapor phase exposure to a fluorinating agent such as anhydrous hydrogen fluoride (HF). In other embodiments, two or more vapor phase reagents are used for removal of the spacer material using self-limiting surface reactions constituting an atomic layer etch (ALE) process. These processes typically involve a surface activation step which may be a chemical oxidation using oxygen ($O_2$), ozone ($O_3$), hydrogen peroxide ($H_2O_2$), or oxygen ($O_2$) plasma, or a halogenating reagent such as fluorine ($F_2$), nitrogen trifluoride ($NF_3$) plasma, xenon difluoride ($XeF_2$), germanium tetrafluoride ($GeF_4$), sulfur tetrafluoride ($SF_4$), chlorine ($Cl_2$), germanium tetrachloride ($GeCl_4$), silicon tetrachloride ($SiCl_4$), or thionyl chloride ($SOCl_2$), followed by a purge step. This activated surface layer is converted into a volatile etch species through the introduction of new ligands by a second etch reagent, which may be a halogen or an organic ligand followed by a purge step.

Examples of representative atomic layer etch (ALE) processes include but are not limited to: i) ALE of $SiO_2$ using trimethyl aluminum ($AlMe_3$) followed by a fluorinating reagent; ii) ALE of silicon nitride using oxidation (e.g., exposure to $O_2$, $O_3$, $H_2O_2$ or $O_2$ plasma), followed by $AlMe_3$ and then a fluorinating reagent; iii) ALE of gallium oxide ($Ga_2O_3$) using a fluorinating reagent followed by a chlorinating reagent such as $SnCl_4$ or $TiCl_4$; iv) ALE of zinc oxide (ZnO) using $O_2$ plasma followed by acetylacetone, or alternatively using a fluorinating reagent followed by aluminum dimethyl chloride ($AlMe_2Cl$); v) ALE of aluminum oxide or "alumina" ($Al_2O_3$) using a fluorinating reagent followed by $AlMe_3$ or $AlMe_2Cl$; vi) ALE of aluminum nitride (e.g., $Al_3N_4$) using tin acetylacetonate ($Sn(AcAc)_2$) followed by a fluorinating reagent; vii) ALE of hafnium oxide of zirconium oxide using a fluorinating reagent followed by $TiCl_4$ or $SiCl_4$, $AlMe_3$, or $AlMe_2Cl$. These vapor phase etch processes may be chosen so as to have high selectivity to other surrounding materials such that the desired voids between conductive material layers may be defined without damaging the surrounding structure.

Figure 13A:
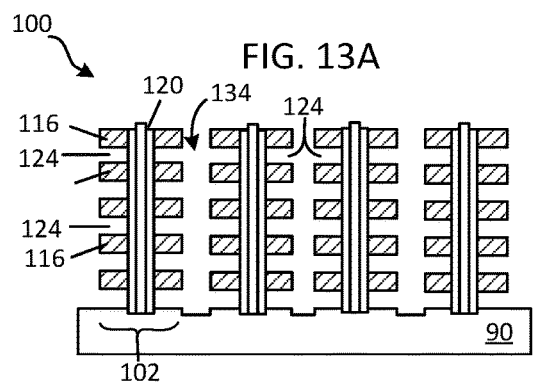
FIGS. 13A and 13B are cross-sectional views taken along line A-A of FIG. 12 and show a memory structure with voids after etching the layers of conductive material in the layer stack, in accordance with some embodiments of the present disclosure.
Figure 13B:
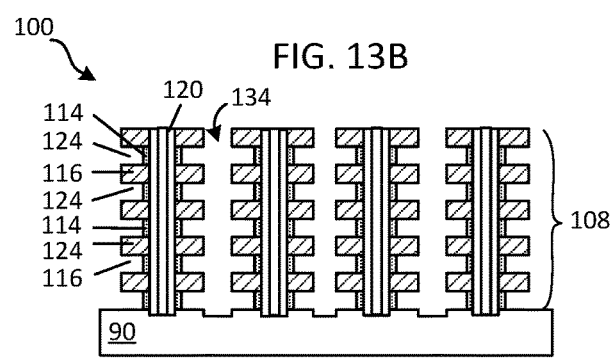

FIGS. 13A and 13B illustrate cross-sectional views of the memory structure 100 of FIG. 12 after etching 330 the insulating material 114 in the layer stack 108, where the section is taken along line A-A of FIG. 12. In FIG. 13A, the insulating material has been completely removed to expose the layers of conductive material 116 and the channel structure 120 where is was previously protected by the insulating material layers. In FIG. 13B, the insulating material 114 in the layer stack 108 has been partially removed to define voids 124 between layers of conductive material 116 while also leaving some of the insulating material 114 on the channel structure 120 between the layers of conductive material 116. As can be seen in these examples, the voids 124 have a profile that conforms to the boundaries defined by the adjacent materials.

Method 300 optionally continues with depositing 333 replacement insulating material in the voids defined by recessing 330 the (first) insulating material of the layer stack. In some such embodiments, the replacement insulating material is selected to be a lower-κ material than the insulating material in the layer stack that it replaces. For example, the replacement insulating material is a poly (methyl methacrylate) pore-destuffed organosilicate glass, an organosilicate compound, porous silicon dioxide, or other suitable low-κ material. In other embodiments, the voids can be partially or completely filled with a replacement insulating material of a lower dielectric constant κ than that of the insulating material that was recessed or removed in process 330. Alternately, the replacement insulating material can be processed, such as by etching, to lower the relative permittivity (or dielectric constant κ). Process 333 can be performed to encapsulate a void laterally between the first insulating material and the replacement insulating material.

Method 300 continues with filling 335 the slit trenches with an isolation material. In one example, the isolation material is a dielectric material which forms a "bread loaf" structure laterally so as to encapsulate the voids, but not completely fill the void. Such material can an oxide, an oxynitride, a nitride, or other suitable material. The isolation material can be deposited using atomic layer deposition (ALD), spin coating, chemical vapor deposition, evaporation, or other suitable process. In some embodiments, the isolation material can be aluminum oxide ($Al_2O_3$), silicon nitride ($Si_3N_4$), silicon dioxide ($SiO_2$), carbon-doped silicon dioxide ($SiO_2$:C), or spin-on glass, to name a few examples. In some embodiments, filling 335 the slit trenches is performed with a replacement insulating material that partially or completely fills the voids defined in process 330.

Figure 14A:
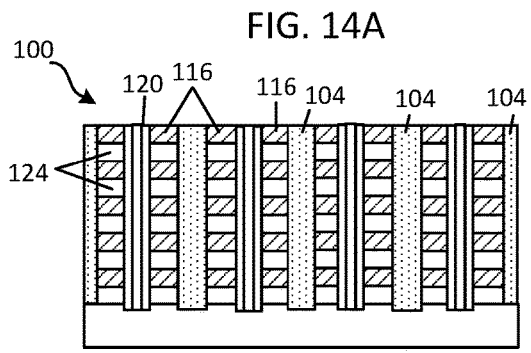
FIGS. 14A and 14B are cross-sectional view of the structures of FIGS. 13A and 13B, respectively, after filling the slit trenches, in accordance with an embodiment of the present disclosure.
Figure 14B:
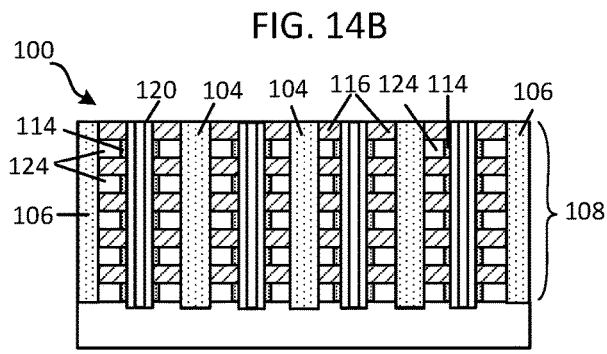

FIGS. 14A and 14B illustrate the example memory structures of FIGS. 13A and 13B, respectively, after filling the slit trenches with isolation or gap fill material 104 and depositing spacer material 106 on the sides of the memory structure 100. In some embodiments, the spacer material 106 and the gap fill material 104 are the same material and are deposited during the same process. For example, the sides of the memory structure 100 are defined by trenches in a layer of interlayer dielectric material. Such trenches may be similar to slit trenches between memory strings 102, where deposition of the gap fill material 104 is applied between memory strings 102 and to outside faces of memory strings 102 in the same process. Due to the aspect ratio of the voids 124, the non-reflowable dielectric used for the gap fill material 104 does not completely fill the voids 124, but instead closes each void 124 along the ends of the layers of conductive material 116, in accordance with some embodiments. In other embodiments, the voids 124 are partially filled with the non-reflowable dielectric used for the gap fill material, and remain partially voided upon completion of processing.

Figure 15A:
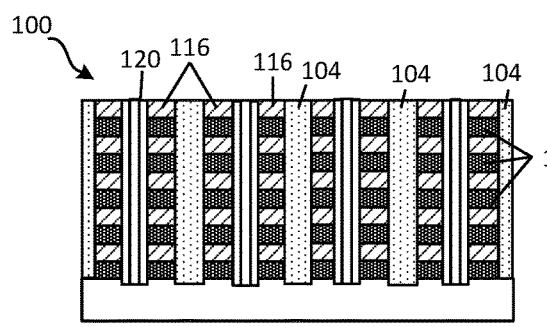
FIGS. 15A and 15B are cross-sectional views of the structures of FIGS. 13A and 13B, respectively, after depositing replacement insulating material in the voids and filling the slit trenches, in accordance with an embodiment of the present disclosure.
Figure 15B:
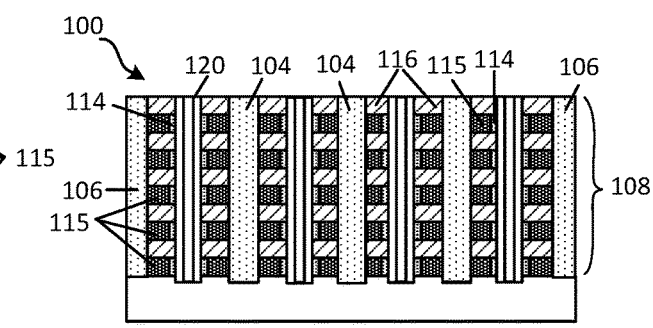
Figure 15C:
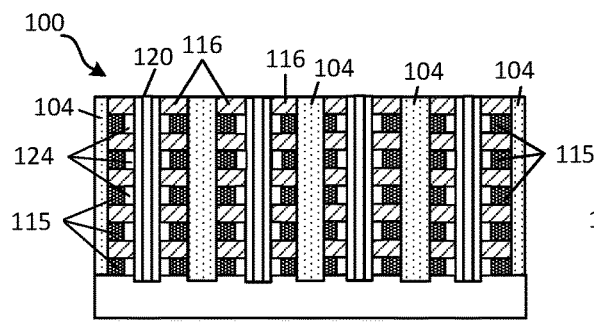
FIGS. 15C and 15D are cross-sectional views of the structure of FIGS. 13A and 13B after partially filling voids with replacement insulating material and filling the slit trenches, in accordance with another embodiment of the present disclosure.
Figure 15D:
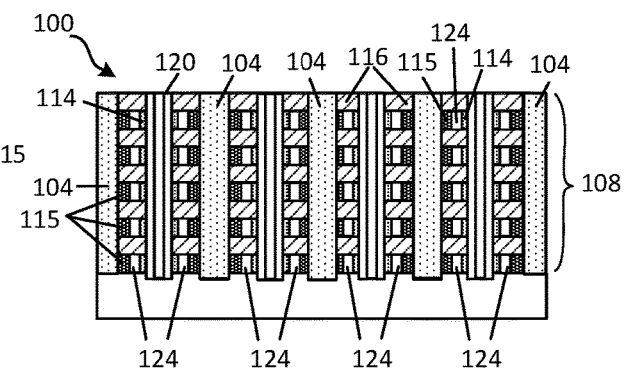

FIGS. 15A and 15B illustrate the example memory structures of FIGS. 13A and 13B, respectively, after depositing replacement insulating material 115 in the voids 124, filling the slit trenches with isolation or gap fill material 104 and depositing spacer material 106 on the sides of the memory structure 100. FIGS. 15C and 15D illustrate the example memory structures of FIGS. 13A and 13B, respectively, after partially filling the void 124 with replacement insulation material 115. Here, a void 124 is laterally between the first insulating material 114 and the replacement insulating material 115. Slit trenches have been filled with gap fill material 104.

Method 300 optionally continues with completing 340 the memory structure. In one example, process 340 includes deposition of interlayer dielectric (ILD) on the memory structure and etching the ILD to form vias extending vertically to layers of conductive material in the layer stacks as well as to the channel structures. The vias can be filled with a metal. Process 340 may also include formation of bitlines, select lines, source lines, and the associated contacts, in accordance with some embodiments.

Method 300 optionally continues with completing 345 the integrated circuit (IC) as desired. Such additional processing to complete an IC may include back-end or back-end-of-line (BEOL) processing to form one or more metallization layers and/or to interconnect the memory structures formed, for example. Any other suitable processing may be performed, as will be apparent in light of this disclosure.

Note that the processes in method 300 are shown in a particular order for ease of description. However, one or more of the processes may be performed in a different order or may not be performed at all (and thus be optional), in accordance with some embodiments. For example, some or all of processes 305-325 may be optional in some embodiments. Numerous variations on method 300 and the techniques described herein will be apparent in light of this disclosure.

Example System

Figure 16:
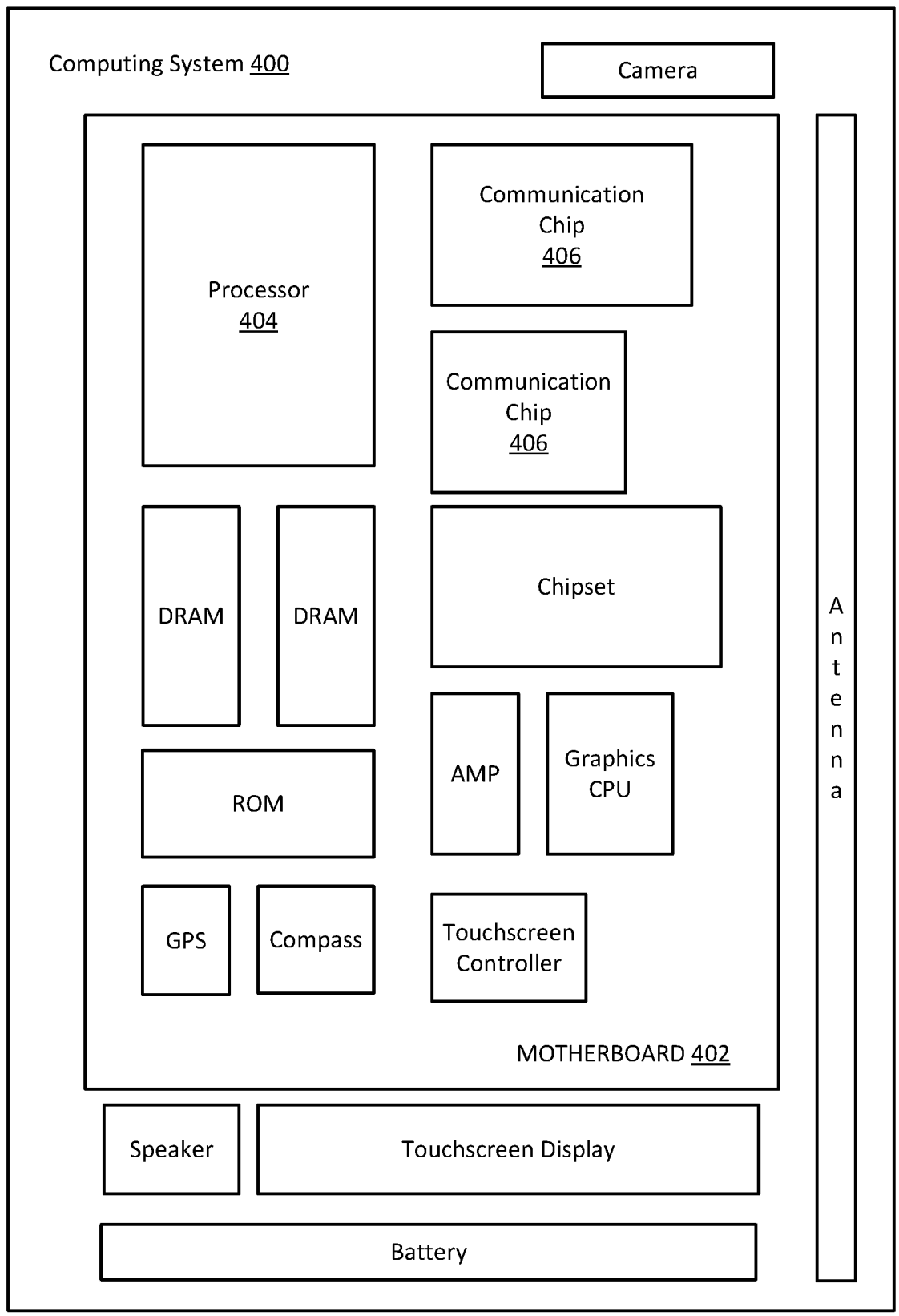
FIG. 16 illustrates an example computing system implemented with integrated circuit structures and/or memory structures formed in accordance with some embodiments of the present disclosure.

FIG. 16 is an example computing system implemented with one or more of the memory structures as disclosed herein, in accordance with some embodiments of the present disclosure. As can be seen, the computing system 400 houses a motherboard 402. The motherboard 402 may include a number of components, including, but not limited to, a processor 404 and at least one communication chip 406, each of which can be physically and electrically coupled to the motherboard 402, or otherwise integrated therein. As will be appreciated, the motherboard 402 may be, for example, any printed circuit board, whether a main board, a daughterboard mounted on a main board, or the only board of system 400, etc.

Depending on its applications, computing system 400 may include one or more other components that may or may not be physically and electrically coupled to the motherboard 402. These other components may include, but are not limited to, volatile memory (e.g., DRAM, RRAM, SRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 400 may include one or more integrated circuit structures or devices configured in accordance with an example embodiment (e.g., to include a memory structure having voids between adjacent conductors of a vertical stack, as variously provided herein). In some embodiments, multiple functions can be integrated into one or more chips (e.g., for instance, note that the communication chip 406 can be part of or otherwise integrated into the processor 404).

The communication chip 406 enables wireless communications for the transfer of data to and from the computing system 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others. In some embodiments, communication chip 406 may include a memory structure having voids between adjacent conductors of a vertical stack as variously described herein.

The processor 404 of the computing system 400 includes an integrated circuit die packaged within the processor 404. In some embodiments, the integrated circuit die of the processor includes onboard circuitry that is implemented with one or more integrated circuit structures or devices (e.g., a memory structure having voids between adjacent conductors of a vertical stack) as variously described herein. The term "processor" may refer to any device or portion of a device that processes, for instance, electronic data from registers and/or memory to transform that electronic data into other electronic data that may be stored in registers and/or memory.

The communication chip 406 also may include an integrated circuit die packaged within the communication chip 406. In accordance with some such example embodiments, the integrated circuit die of the communication chip includes one or more integrated circuit structures or devices as variously described herein. As will be appreciated in light of this disclosure, note that multi-standard wireless capability may be integrated directly into the processor 404 (e.g., where functionality of any chips 406 is integrated into processor 404, rather than having separate communication chips). Further note that processor 404 may be a chip set having such wireless capability. In short, any number of processor 404 and/or communication chips 406 can be used. Likewise, any one chip or chip set can have multiple functions integrated therein.

In various implementations, the computing system 400 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit comprising a vertical layer stack of alternating layers of a conductive material and an insulating material, the stack including an insulating material layer between first and second neighboring conductive material layers; and an isolation material along a side of the layer stack, the isolation material compositionally distinct from the insulating material; wherein the insulating material layer has a lateral width that is shorter than a lateral width of the first and second neighboring conductive material layers such that the layer stack defines a void between the first and second neighboring conductive material layers, the void further located between the isolation material and the insulating material.

Example 2 includes the subject matter of Example 1, wherein the vertical layer stack includes a memory cell portion and a staircase portion, wherein layers of the conductive material in the staircase portion extend different lengths away from the memory cell portion in an increasing or decreasing series relative to the memory cell portion.

Example 3 includes the subject matter of Example 1 or 2 and further comprises one or more channel structures extending vertically through the layers of conductive material, wherein a said channel structure includes a body of semiconductor material and a dielectric, wherein the dielectric is between the body and the layers of conductive material.

Example 4 includes the subject matter of Example 2, wherein the void is between the first and second conductive material layers in the staircase portion.

Example 5 includes the subject matter of Example 4, wherein the void is between the first and second conductive material layers in the memory cell portion.

Example 6 includes the subject matter of any of Examples 1-5, wherein the void is one of a plurality of voids, and each void is between corresponding layers of the conductive material.

Example 7 includes the subject matter of any of Examples 1-6, wherein the void is between the first and second conductive material layers in a lower portion of the vertical layer stack.

Example 8 includes the subject matter of any of Examples 1-7, wherein the void extends longitudinally along a length of the first and second conductive material layers, the length being greater than 10 nanometers.

Example 9 includes the subject matter of any of Examples 1-8, wherein the void generally has a rectangular cross-sectional shape.

Example 10 includes the subject matter of any of Examples 1-9, wherein the vertical layer stack is part of a random-access memory structure.

Example 11 is a memory device comprising the integrated circuit of claim 1.

Example 12 includes the subject matter of Example 11 and further comprises a processor.

Example 13 is a vertical memory structure comprising a base of semiconductor material; first and second conductive lines each extending horizontally in a spaced apart fashion within a vertical stack above the base, the vertical stack including a plurality of conductive lines, the first and second conductive lines being part of the plurality; a gate structure extending vertically through at least the first and second conductive lines, the gate structure including a body of semiconductor material and a dielectric, wherein the dielectric is between the body and the first and second conductive lines; and an isolation material along sides of the vertical stack and in contact with the conductive lines, wherein the vertical stack defines a void between at least the first and second conductive lines in the vertical stack and laterally between the gate structure and the isolation material.

Example 14 includes the subject matter of Example 13, wherein the first and second conductive lines are control electrodes, the gate structure further comprising a floating gate electrode between each of the control electrodes and the dielectric of the gate structure.

Example 15 includes the subject matter of Example 13 or 14, wherein the dielectric is a first dielectric, the structure further comprising a second dielectric on the gate structure between the first and second conductive lines, the void positioned between the second dielectric and the isolation material.

Example 16 includes the subject matter of Example 15, wherein the second dielectric is compositionally distinct from the isolation material and the first dielectric.

Example 17 includes the subject matter of any of Examples 13-16, wherein the vertical stack includes a staircase portion and a memory cell portion, wherein the memory cell portion includes the gate structure and wherein the conductive lines in the staircase portion extend different lengths away from the memory cell portion in an increasing or decreasing series.

Example 18 includes the subject matter of Example 17, wherein the void is between the first and second conductive lines at least in the staircase portion.

Example 19 includes the subject matter of Example 17, wherein the void is between the first and second conductive lines at least in the memory cell portion.

Example 20 includes the subject matter of any of Examples 13-19, wherein the void is between the first and second conductive lines in a lower portion of the vertical stack.

Example 21 includes the subject matter of any of Examples 13-20, wherein the void extends longitudinally along a length of the first and second conductive lines.

Example 22 includes the subject matter of any of Examples 13-21, wherein a vertical distance between the first and second conductive lines is less than 30 nm.

Example 23 includes the subject matter of any of Examples 13-21, wherein a vertical distance between the first and second conductive lines is less than 20 nm.

Example 24 includes the subject matter of any of Examples 13-21, wherein a vertical distance between the first and second conductive lines is less than 10 nm.

Example 25 includes the subject matter of any of Examples 13-24, wherein the void has a vertical height of at least 5 nm, a lateral width of at least 5 nm, and a length along the first and second conductive lines of at least 20 nm.

Example 26 includes the subject matter of any of claims 13-25, wherein the first and second conductive lines are wordlines.

Example 27 includes the subject matter of any of claims 13-26, wherein the vertical stack is a first stack of a plurality of vertical stacks spaced laterally by the isolation material.

Example 28 includes the subject matter of any of claims 13-27, wherein the memory structure is part of vertical NAND memory structure, a vertical RRAM structure, or a vertical DRAM structure.

Example 29 is a vertical memory structure comprising a base of semiconductor material; first and second conductive lines each extending horizontally in a spaced apart fashion within a vertical stack above the base, the vertical stack including a plurality of conductive lines, the first and second conductive lines being part of the plurality; a gate structure extending vertically through at least the first and second conductive lines, the gate structure including a body of semiconductor material and a dielectric, wherein the dielectric is between the body and the first and second conductive lines; and a first insulating material layer on the gate structure between the first and second conductive lines, the first insulating material having a lateral width that is shorter than a lateral width of the first and second conductive lines; and a second insulating material layer between the first and second conductive lines and adjacent the first insulating material layer.

Example 30 includes the subject matter of Example 29 and further comprises an isolation material along sides of the vertical stack and in contact with the conductive lines and the second insulating material layer, the isolation material being compositionally distinct from the second insulating material.

Example 31 includes the subject matter of Example 29 or 30, wherein the vertical stack defines a void between at least the first and second conductive lines in the vertical stack and laterally between the first insulating material and the second insulating material.

Example 32 includes the subject matter of any of Examples 29-31, wherein the second insulating material comprises one or more of (i) poly (methyl methacrylate), (ii) organosilicate glass, and (iii) porous silicon dioxide.

Example 33 includes the subject matter of any of Examples 29-32, wherein the vertical layer stack includes a memory cell portion and a staircase portion, and wherein the void is between the first and second conductive material layers in the staircase portion.

Example 34 includes the subject matter of any of Examples 29-32, wherein the vertical layer stack includes a memory cell portion and a staircase portion, and wherein the void is between the first and second conductive material layers in the memory cell portion.

Example 35 is a method of fabricating a memory structure, the method comprising providing layer stack with alternating layers of an insulating material and a conductive material; etching holes vertically through layers of the layer stack; depositing a first dielectric along an inside of the holes; depositing a semiconductor material on an inside of the first dielectric such that the first dielectric is between the semiconductor material and layers of the conductive material; laterally recessing the insulating material between adjacent layers of the conductive material to define voids between adjacent layers of the conductive material; and depositing an isolation material along sides of the layer stack, the isolation material in contact with sides of the conductive material, wherein the voids are positioned between adjacent layers of the conductive material and further positioned between the isolation material and the first dielectric.

Example 36 includes the subject matter of Example 35, wherein laterally recessing the insulating material is performed with an atomic layer etch.

Example 37 includes the subject matter of Examples 35 or 36 and further comprises etching slit trenches in the layer stack to define a plurality of layer stacks.

Example 38 includes the subject matter of any of Examples 35-37 and further comprises depositing the isolation material in the slit trenches after laterally recessing the insulating material.

Example 39 includes the subject matter of any of Example 35-38 and further comprises etching the layer stack to define a staircase portion adjacent a memory cell portion that includes the holes.

Example 40 includes the subject matter of any of Examples 35-39 and further comprises recessing the conductive material after etching the holes; depositing a second dielectric on the conductive material; depositing a metal on the dielectric, wherein the second dielectric and the metal are between the first dielectric and the conductive material.

Example 41 is a computing system comprising the integrated circuit of any of claims 1-10 or the memory structure of any of claims 13-34.

Example 42 includes the subject matter of Example 41 and further comprises a touch screen display.

Example 43 includes the subject matter of Example 41 or 42 and further comprises a processor.

Example 44 includes the subject matter of any of Examples 41-43 and further comprises a communication chip.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future-filed applications claiming priority to this application may claim the disclosed subject matter in a different manner and generally may include any set of one or more limitations as variously disclosed or otherwise demonstrated herein.

What is claimed is:

1. An integrated circuit comprising:
   a vertical layer stack of alternating layers of a conductive material and an insulating material, the stack including an insulating material layer between first and second neighboring conductive material layers; and
   an isolation material along a side of the layer stack, the isolation material compositionally distinct from the insulating material;
   wherein the insulating material layer has a lateral width that is shorter than a lateral width of the first and second neighboring conductive material layers such that the layer stack defines a void between the first and second neighboring conductive material layers, the void further located between the isolation material and the insulating material.

2. The integrated circuit of claim 1, wherein the vertical layer stack includes a memory cell portion and a staircase portion, the integrated circuit further comprising one or more channel structures extending vertically through the layers of conductive material, wherein a said channel structure includes a body of semiconductor material and a dielectric, wherein the dielectric is between the body and the layers of conductive material.

3. The integrated circuit of claim 1, wherein the vertical layer stack includes a memory cell portion and a staircase portion, and wherein the void is between the first and second conductive material layers in the staircase portion.

4. The integrated circuit of claim 3, wherein the void is between the first and second conductive material layers in the memory cell portion.

5. The integrated circuit of claim 1, wherein the void is one of a plurality of voids and each void is between corresponding layers of the conductive material.

6. The integrated circuit of claim 1, wherein the void is between the first and second conductive material layers in a lower portion of the vertical layer stack.

7. A vertical memory structure comprising:
   a base of semiconductor material;
   first and second conductive lines each extending horizontally in a spaced apart fashion within a vertical stack above the base, the vertical stack including a plurality of conductive lines, the first and second conductive lines being part of the plurality;
   a gate structure extending vertically through at least the first and second conductive lines, the gate structure including a body of semiconductor material and a dielectric, wherein the dielectric is between the body and the first and second conductive lines;
   a first insulating material layer on the gate structure between the first and second conductive lines, the first insulating material having a lateral width that is shorter than a lateral width of the first and second conductive lines;

a second insulating material layer between the first and second conductive lines and adjacent the first insulating material layer, wherein the vertical stack defines a void between at least the first and second conductive lines in the vertical stack and laterally between the first insulating material and the second insulating material.

8. The vertical memory structure of claim 7 further comprising: an isolation material along sides of the vertical stack and in contact with the conductive lines and the second insulating material layer, the isolation material being compositionally distinct from the second insulating material.

9. The vertical memory structure of claim 7, wherein the second insulating material comprises one or more of (i) poly (methyl methacrylate), (ii) organosilicate glass, and (iii) porous silicon dioxide.

10. The integrated circuit of claim 7, wherein the vertical layer stack includes a memory cell portion and a staircase portion, and wherein the void is between the first and second conductive material layers in the staircase portion.

11. The integrated circuit of claim 7, wherein the vertical layer stack includes a memory cell portion and a staircase portion, and wherein the void is between the first and second conductive material layers in the memory cell portion.

12. A vertical memory structure comprising:
a base of semiconductor material; first and second conductive lines each extending horizontally in a spaced apart fashion within a vertical stack above the base, the vertical stack including a plurality of conductive lines, the first and second conductive lines being part of the plurality;
a gate structure extending vertically through at least the first and second conductive lines, the gate structure including a body of semiconductor material and a dielectric, wherein the dielectric is between the body and the first and second conductive lines; and
an isolation material along sides of the vertical stack and in contact with the conductive lines, wherein the vertical stack defines a void between at least the first and second conductive lines in the vertical stack and laterally between the gate structure and the isolation material.

13. The vertical memory structure of claim 12, wherein the dielectric is a first dielectric, the structure further comprising a second dielectric on the gate structure between the first and second conductive lines, the void positioned between the second dielectric and the isolation material.

14. The vertical memory structure of claim 13, wherein the second dielectric is compositionally distinct from the isolation material and compositionally distinct from the first dielectric.

15. The vertical memory structure of claim 12, wherein the vertical stack includes a staircase portion and a memory cell portion, wherein the memory cell portion includes the gate structure and wherein the conductive lines in the staircase portion extend different lengths away from the memory cell portion in an increasing or decreasing series, and wherein the void is between the first and second conductive lines in at least one of the staircase portion and the memory cell portion.

16. The vertical memory structure of claim 12, wherein the void is between the first and second conductive lines in a lower portion of the vertical stack.

17. The vertical memory structure of claim 12, wherein the void extends longitudinally along a length of the first and second conductive lines.

18. The vertical memory structure of claim 12, wherein a vertical distance between the first and second conductive lines is less than 30 nm.

19. The vertical memory structure of claim 12, wherein the void has a vertical height of at least 5 nm, a lateral width of at least 5 nm, and a length along the first and second conductive lines of at least 20 nm.

* * * * *